United States Patent [19]
Lee et al.

[11] Patent Number: 6,133,091
[45] Date of Patent: Oct. 17, 2000

[54] METHOD OF FABRICATING A LOWER ELECTRODE OF CAPACITOR

[75] Inventors: Tong-Hsin Lee, Taipei Hsien; Hsi-Mao Hsiao, Hsinchu; Wen-Shan Wei, Taipei Hsien; Chun-Lung Chen, Tainan Hsien, all of Taiwan

[73] Assignees: United Silicon Inc.; United Microelectronics Corp., both of Hsinchu, Taiwan

[21] Appl. No.: 09/434,688

[22] Filed: Nov. 5, 1999

[51] Int. Cl.[7] .................. H01L 21/8242; H01L 21/20
[52] U.S. Cl. .................. 438/254; 438/397; 438/253; 438/256; 438/390; 438/396; 438/398; 438/399; 438/400
[58] Field of Search .................. 438/397, 253, 438/254, 256, 390, 396, 398, 399, 400

[56] References Cited

U.S. PATENT DOCUMENTS

| | | | |
|---|---|---|---|
| 5,478,769 | 12/1995 | Lim | 438/253 |
| 5,677,222 | 10/1997 | Tseng | 438/253 |
| 5,770,499 | 6/1998 | Kwok et al. | 438/253 |
| 5,843,822 | 12/1998 | Hsia et al. | 438/238 |
| 5,851,876 | 12/1998 | Jenq | 438/253 |
| 5,879,987 | 3/1999 | Wang | 438/253 |
| 5,907,774 | 5/1999 | Wise | 438/254 |
| 5,909,621 | 6/1999 | Hsia et al. | 438/254 |
| 5,937,306 | 8/1999 | Kim | 438/397 |

*Primary Examiner*—Brian Dutton
*Assistant Examiner*—Brook Kebede
*Attorney, Agent, or Firm*—Charles C. H. Wu; Charles C. H. Wu & Associates, APC

[57] ABSTRACT

A method of fabricating a lower electrode of a capacitor. A sacrificial multilayer is formed on a semiconductor layer. The sacrificial multi-layer is a stack of alternating first and second sacrificial layers. A patterned first mask layer having a first opening above a conductive plug in the semiconductor substrate is formed on the sacrificial multi-layer. A planar spacer is formed on the sidewall of the first opening. A second mask layer is formed to fill the first opening. The planar spacer and the sacrificial multi-layer thereunder are anisotropically etched until the semiconductor substrate is exposed to form a second opening while using the first mask layer and second mask layer as a mask. The first sacrificial layers exposed by the second opening are isotropically etched to form a plurality of recesses. The second opening and the recesses are filled with a conductive material layer. Finally, the first mask layer, second mask layer, and sacrificial multi-layer are removed.

20 Claims, 6 Drawing Sheets

METHOD OF FABRICATING A LOWER ELECTRODE OF CAPACITOR

BACKGROUND OF THE INVENTION

1. Field of the Invention

The present invention relates to a method of fabricating a dynamic random access memory (DRAM), and more particularly to a method of fabricating a lower electrode of a DRAM capacitor.

2. Description of the Related Art

A dynamic random access memory cell, normally called a memory cell, includes a transistor and a capacitor. The capacitor is used to store a bit of data in a memory device. Data storage for DRAM selectively charges or discharges each capacitor in the capacitor array on a semiconductor substrate. When the thickness and dielectric constant of capacitor dielectric layer are both fixed for a capacitor with a fixed operative voltage, the capacitance of the capacitor is decided by the surface area of the capacitor electrode.

The size of a DRAM cell is gradually reduced as the integration of integrated circuits is continuously increased. It is well known by people skilled in the art that the capacitance of the capacitor is decreased since its size is reduced. The decreased capacitance easily causes soft errors by α rays, which results in a data storage failure in the memory cells. Therefore, a capacitor structure with high integration and capacitance is required, thereby keeping a desired capacitance under the circumstances in which the size of the capacitor is reduced to make possible a DRAM with high capacitance and good performance.

A method in the prior art of increasing the surface area of capacitor electrode is to increase the height of the capacitor. However, increasing the height of the capacitor relatively increases the aspect radio of the contact, and thus increases the difficulty of contact etching.

SUMMARY OF THE INVENTION

The present invention therefore provides an improved method of fabricating a lower electrode of a capacitor with a tree-like structure, and thereby increases the capacitance of the capacitor to improve the performance of the capacitor.

The invention provides a method of fabricating a lower electrode of a capacitor. The method of the invention comprises the following steps. A semiconductor substrate is provided. The substrate has a conductive plug electrically connected to a conductive region. A first polysilicon layer is formed on the substrate. A sacrificial multi-layer is formed on the first polysilicon layer. The sacrificial multi-layer is a stack of alternating first and second sacrificial layers. A second polysilicon layer is formed on the sacrificial multi-layer. The second polysilicon layer is patterned to form a first opening therein above the conductive plug. A planar spacer is formed on the sidewall of the first opening. A third polysilicon layer is formed to fill the first opening. The planar spacer and the sacrificial multi-layer thereunder are anisotropically etched until the semiconductor substrate is exposed to form a second opening while using the second polysilicon layer and third polysilicon layer as a mask. The first sacrificial layers exposed on the second opening are isotropically etched to form a plurality of recesses. By controlling the formation of the recess width, the recesses and the conductive plug are overlaid, and adjacent recesses are not in contact with each other. A fourth polysilicon layer is formed to fill the second opening and the recesses. The second polysilicon layer, the third polysilicon layer and the sacrificial multi-layer are removed in sequence. Finally, the exposed part of the first polysilicon layer is removed so that the adjacent lower electrodes do not bridge together. A tree-shaped lower electrode is constructed from the residual part of the fourth polysilicon and the first polysilicon.

The invention also provides another method of fabricating a lower electrode of a capacitor. The method of the invention comprises the following steps. A semiconductor substrate is provided. The substrate has a conductive plug electrically connected to a conductive region. A sacrificial multi-layer is formed on the substrate. The sacrificial multi-layer is a stack of alternating first and second sacrificial layers. A patterned first mask layer having a first opening above the conductive plug is formed on the sacrificial multi-layer. A planar spacer is formed on the sidewall of the first opening. The planar spacer and the sacrificial multi-layer thereunder are anisotropically etched until the substrate is exposed to form a second opening while using the first mask layer and second mask layer as a mask. The first sacrificial layers exposed on the second opening are isotropically etched to form a plurality of recesses. By controlling the formation of the recess width, the recesses and the conductive plug are overlaid, and adjacent recesses are not in contact with each other. The second opening and the recesses are filled with a conductive material layer to form a tree-shaped lower electrode. Finally, the first mask layer, second mask layer and sacrificial multi-layer are removed in sequence, and a tree-shaped lower electrode is formed.

According to the method of the invention, a tree-shaped lower electrode is formed and the surface area of the lower electrode is increased, and thereby the capacitance of the capacitor is effectively enhanced and the performance of the capacitor is improved.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

The method of fabricating a lower electrode of a capacitor according to the invention can have several variations. Several embodiments of the invention are, for example, shown in the following.

Embodiment 1:

FIGS. 1A–1J are drawings, schematically illustrating a tree-shaped lower electrode of a capacitor according to a first preferred embodiment of the invention.

Figure 1A:
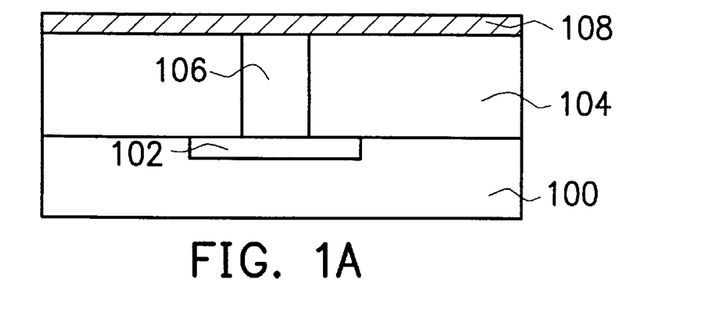
FIGS. 1A–1J are schematic, cross-sectional views illustrating fabrication of a lower electrode according to one preferred embodiment of the present invention.

Referring to FIG. 1A, a semiconductor substrate 100 is provided. A semiconductor device, such as a transistor (not shown), has been formed in the semiconductor substrate 100. The semiconductor substrate 100 has a conductive region 102, such as a source/drain (S/D) region. An insulating layer 104, such as a silicon oxide layer, is formed on the substrate 100 as an interlayer dielectric layer (ILD). The insulating layer 104 has a conductive plug 106, made of polysilicon or doped polysilicon, electrically connected to the conductive region 102.

Next, a first polysilicon layer 108, which can be deposited by chemical vapor deposition (CVD), is formed on the semiconductor substrate 100. The polysilicon layer 108 is preferably made of doped polysilicon.

Figure 1B:
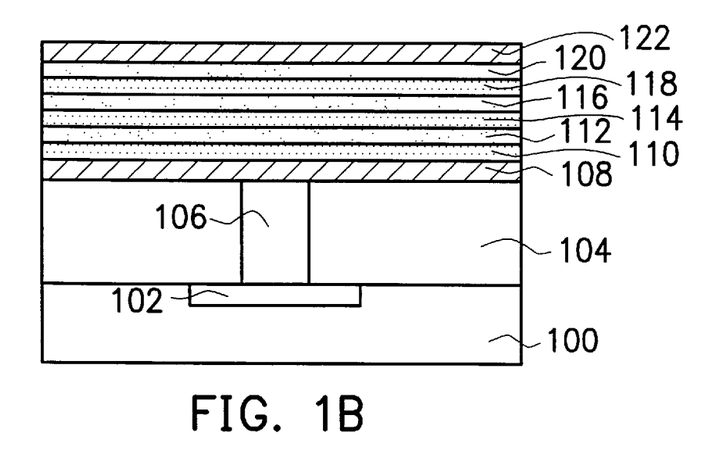

Referring to FIG. 1B, a sacrificial multi-layer is formed on the polysilicon layer 108. The sacrificial multi-layer is a stack of alternating first and second sacrificial layers, in which the first sacrificial layers are indicated by reference numbers 110, 114, 118 and the second sacrificial layers are indicated by reference numbers 112, 116, 120, as shown in FIG. 1B. The first sacrificial layers can be made of silicon nitride by CVD, and the second sacrificial layers can be made of silicon oxide by CVD. Next, a second polysilicon layer 122, for example made by CVD, is formed on the sacrificial multi-layer.

Figure 1C:
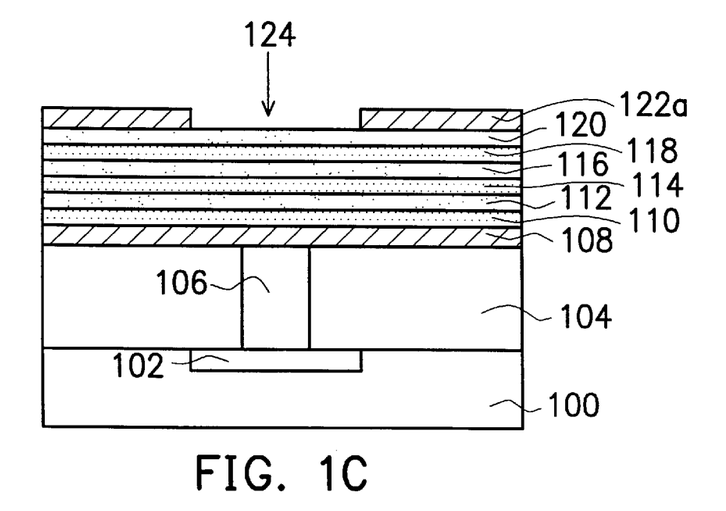

Referring to FIG. 1C, the polysilicon layer 122 is then patterned by a conventional photolithography and etching process to form a first opening 124 above the conductive plug 106 in the polysilicon layer 122, and thereby a polysilicon layer 122a is formed.

Figure 1D:
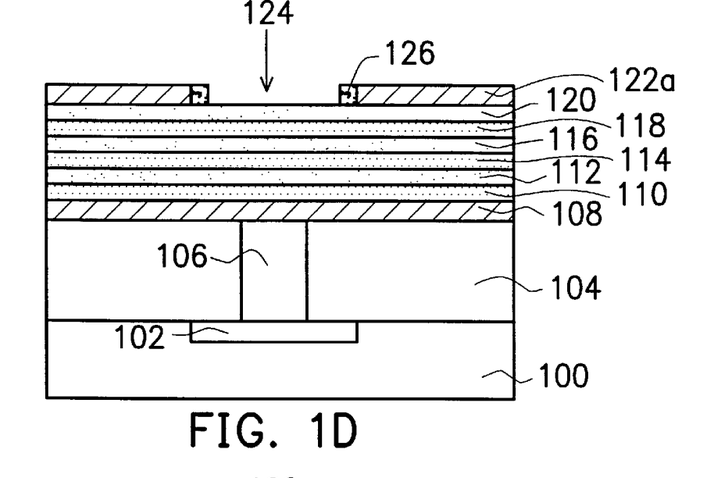

Referring to FIG. 1D, a planar spacer 126 is formed on the sidewall of first opening 124. The planar spacer 126 has a uniform width from top to bottom. The method of forming the planar spacer 126 includes, for example, the following steps. A conformal spacer material layer, such as a silicon oxide layer, is formed over the whole substrate 100 (i.e. formed on the second polysilicon 122a and in the first opening 124). The spacer material layer on the polysilicon layer 122a and on the bottom of the opening 124 is then removed by back etching, and thereby the planar spacer 126 with the same width from top to bottom is formed.

Figure 1E:
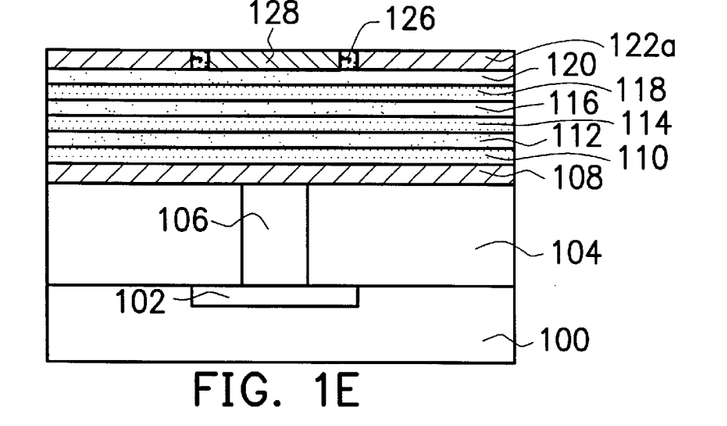

Referring to FIG. 1E, a third polysilicon layer 128 is formed to fill the first opening 124. The third polysilicon layer 128 is formed by depositing a polysilicon layer over the substrate 100, and then chemical mechanic polishing (CMP) or back etching is performed until the planar spacer 126 is exposed.

Figure 1F:
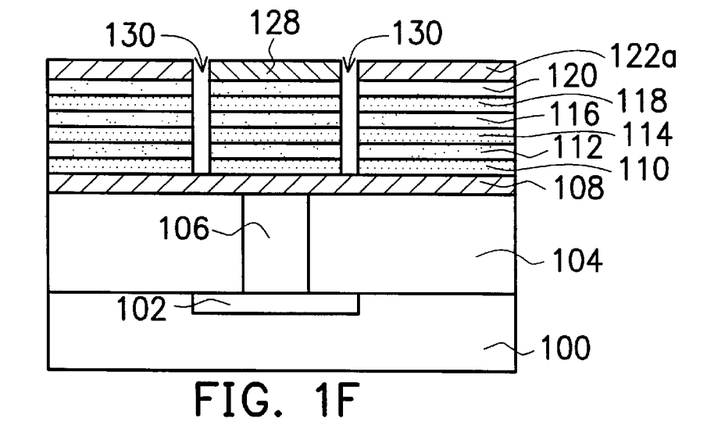

Referring to FIG. 1F, the planar spacer 126 and the sacrificial multi-layer thereunder are anisotropically etched until the polysilicon layer 108 is exposed to form a second opening 130 while using the second polysilicon layer 122a and third polysilicon layer 128 as a mask. The size of the second opening made by above steps can be free from the limitation of the critical dimension.

Figure 1G:
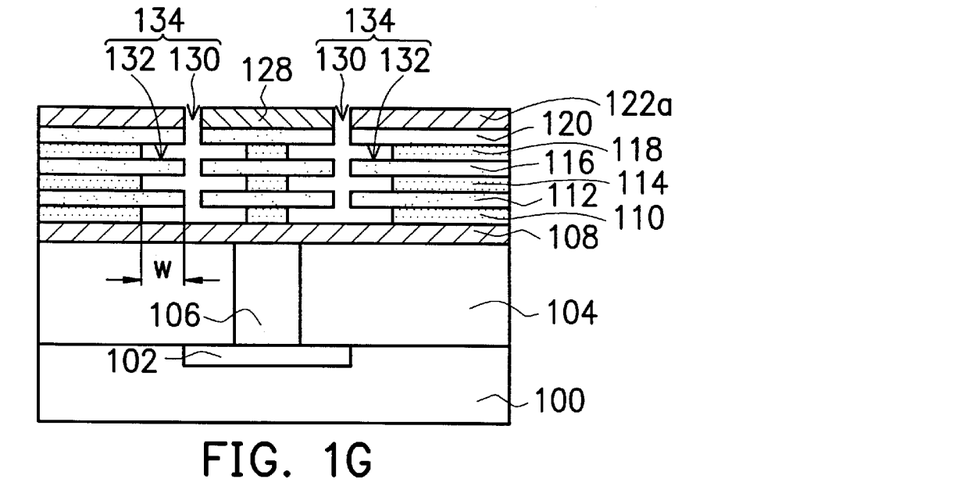

Referring to FIG. 1G, the first sacrificial layers 110, 114, 118 are then isotropically etched to form a plurality of recesses along the etched first sacrificial layers. The second opening 130 and recesses 132 together compose a tree-shaped opening 134. The first sacrificial layers, made of, for example, silicon nitride, can be isotropically etched by phosphoric acid ($H_3PO_4$) solution. Since the etching rate on the silicon nitride layer is slow enough, the width (w) of the recesses can be effectively controlled. The recesses 132 and the conductive plug 106 are overlaid by suitably controlling the formation of the recess width, so that a lower electrode subsequently formed therein is electrically connected to the conductive plug 106 and adjacent recesses are not in contact with each other. Hence, the second sacrificial layers supported by the first sacrificial layers will not fall down because the first sacrificial layers will not be over-etched, and adjacent lower electrodes subsequently formed will not bridge together.

Figure 1H:
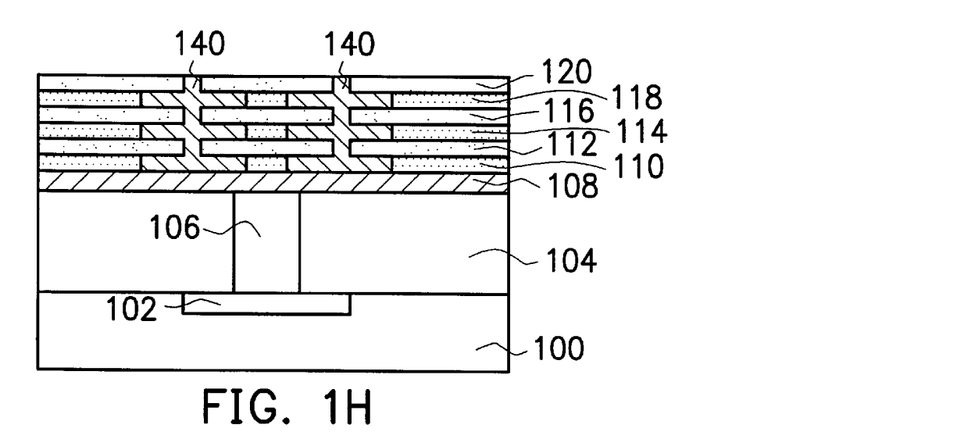

Referring to FIG. 1H, a fourth polysilicon layer 140 is formed to fill the tree-shaped opening 134 (the second opening 130 and the recesses 132). The fourth polysilicon layer 140 is preferably made of doped polysilicon. The fourth polysilicon layer 140 is formed by CVD to fill the tree-shaped opening 134, and then the exposed fourth polysilicon layer, the second polysilicon layer and third polysilicon layer are removed by CMP or back etching.

Figure 1I:
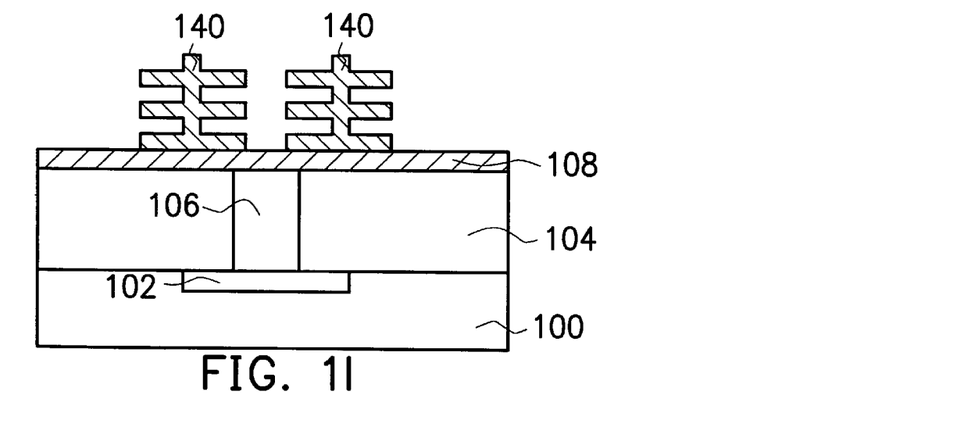

Next, referring to FIG. 1I, the sacrificial multi-layer is removed. The second sacrificial layers 120, 116, 112 and the first sacrificial layers 118, 114, 110 are removed by buffer oxide etching (BOE) solution and phosphoric acid solution, alternatingly, to leave the tree-shaped polysilicon layer 140.

Figure 1J:
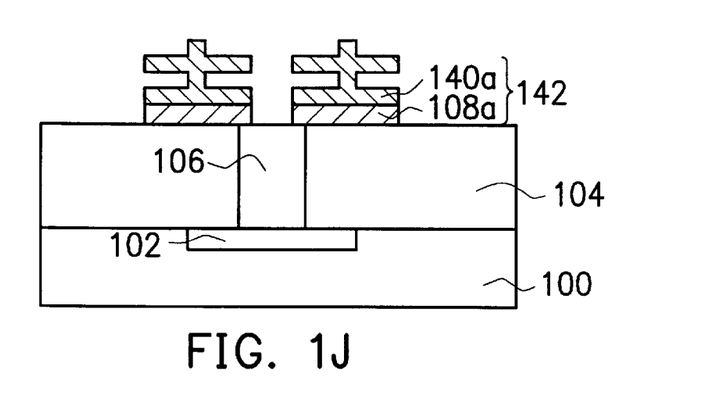

Referring to FIG. 1J, the part of the polysilicon layer 108 between two adjacent polysilicon layers 140 is removed to prevent a bridge of the polysilicon layers 140. The exposed part of the polysilicon layer 108 is removed by anisotropic etching, and thereby polysilicon layer 140a and 108a are formed. The polysilicon layer 140a and 108a construct a lower electrode 142 of a capacitor.

A capacitor dielectric layer and an upper electrode (not shown) are formed on the lower electrode 142 to complete a capacitor.

Embodiment 2:

FIGS. 2A–2H are drawings, schematically illustrating a tree-shaped lower electrode of a capacitor according to a second preferred embodiment of the invention.

Figure 2A:
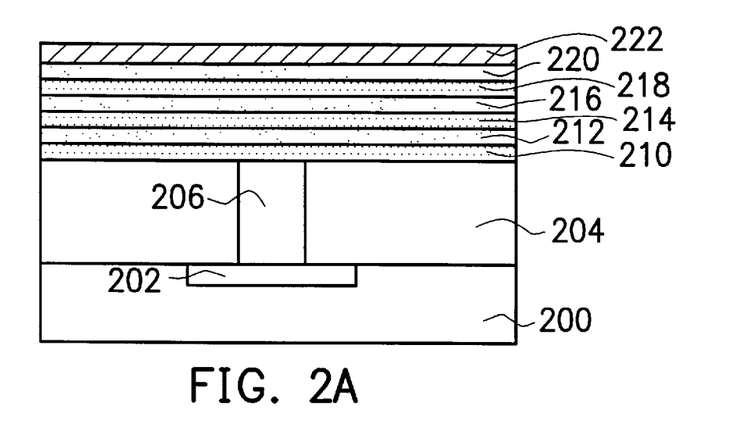
FIGS. 2A–2H are schematic, cross-sectional views illustrating fabrication of a lower electrode according to another preferred embodiment of the present invention.

Referring to FIG. 2A, a semiconductor substrate 200 having a conductive region 202 is provided. An insulating layer 204 is formed on the substrate 200 and a conductive plug 206 therein is electrically connected to the conductive region 202.

Next, a sacrificial multi-layer is formed on the semiconductor substrate 200. The sacrificial multi-layer is a stack of alternating first and second sacrificial layers, in which the first sacrificial layers are designated by numbers 210, 214, 218 and the second sacrificial layers are designated by numbers 212, 216, 220. The first sacrificial layers can be made of silicon nitride by CVD, and the second sacrificial layers can be made of silicon oxide by CVD. Next, a first mask layer 222, such as a polysilicon layer, is formed on the sacrificial multi-layer.

Figure 2B:
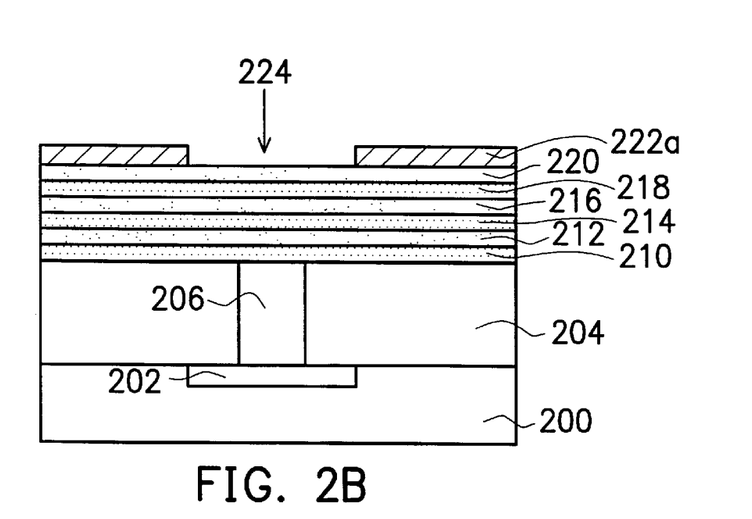

Referring to FIG. 2B, the first mask layer 222 is then patterned by conventional photolithography and etching process to form a first opening 224 therein above the conductive plug 206, and thus a patterned first mask layer 222a is formed.

Figure 2C:
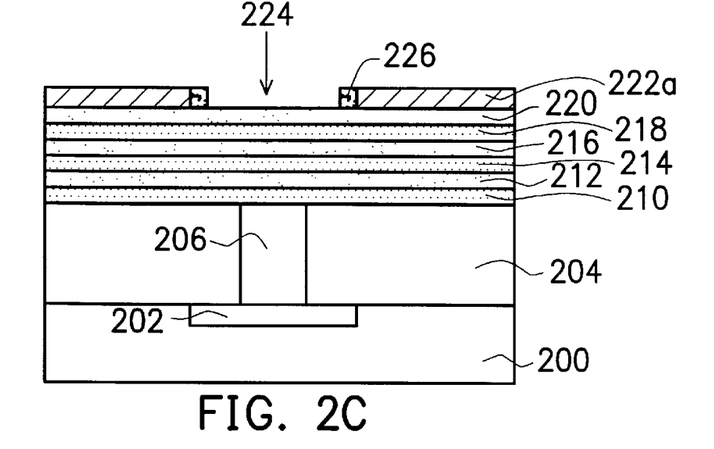

Referring to FIG. 2C, a planar spacer 226 is formed on the sidewall of the first opening 224. The planar spacer 226 has the same width from top to bottom. The method of forming the planar spacer 226, for example, includes the following steps. A conformal spacer material layer, such as a silicon oxide layer, is formed over the whole substrate 200 (i.e. formed on the first mask layer 222a and in the first opening 224).

The spacer material layer on the polysilicon layer 222a and on the bottom of the opening 224 is then removed by back etching, and thereby the planar spacer 226 with the same width from top to bottom is formed.

Figure 2D:
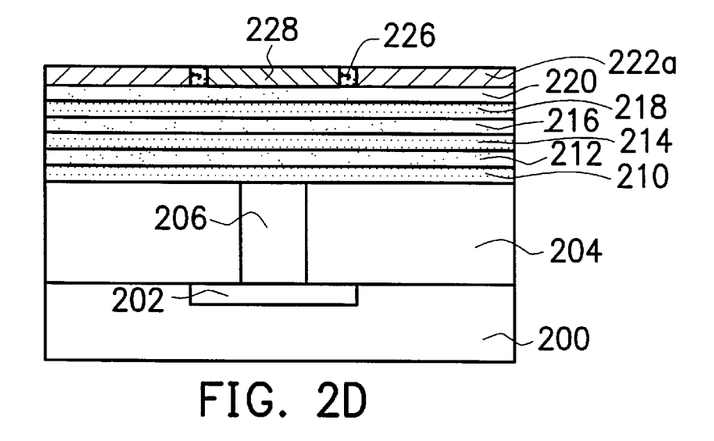

Referring to FIG. 2D, a second mask layer 228 is formed to fill the first opening 224. The second mask layer 228 is formed by depositing a mask material layer such as a polysilicon layer over the substrate 200, and then CMP or a back etching process is performed until the planar spacer 226 is exposed.

Figure 2E:
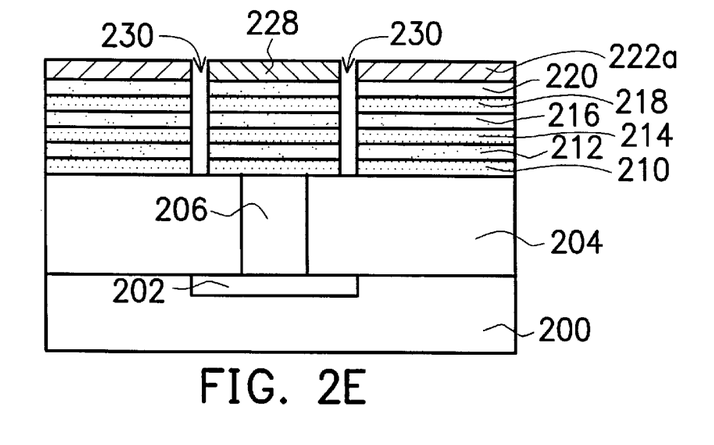

Referring to FIG. 2E, the planar spacer 226 and the sacrificial multi-layer thereunder are anisotropically etched until the insulating layer 204 is exposed to form a second opening 230 while using the first mask layer 222a and second mask layer 228 as a mask.

Figure 2F:
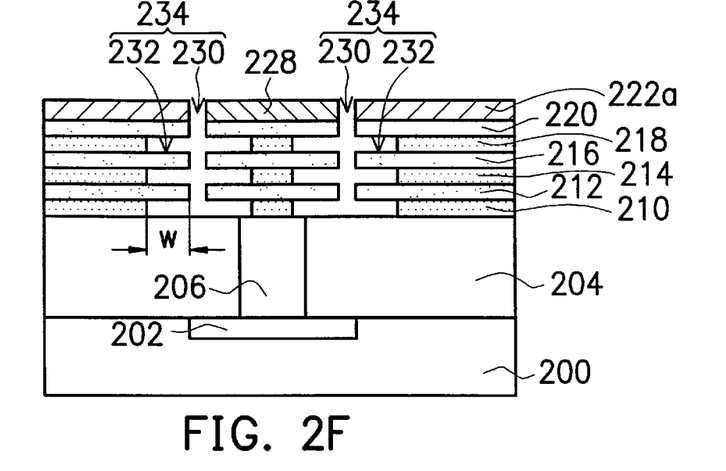

Referring to FIG. 2F, the first sacrificial layers 210, 214, 218 are then isotropically etched to form a plurality of recesses along the etched first sacrificial layers. The second opening 230 and recesses 232 together compose a tree-shaped opening 234. The first sacrificial layer, made of, for example, silicon nitride, is isotropically etched by phosphoric acid solution. Since the etching rate on the silicon nitride layer is slow enough, the width (w) of the recesses 232 can be effectively controlled. The recesses 232 and the conductive plug 206 are overlaid by suitably controlling the formation of the recess width, so that a lower electrode subsequently formed therein is electrically connected to the conductive plug 106 and adjacent recesses are not in contact with each other. Hence, the second sacrificial layers supported by the first sacrificial layers will not fall down because the first sacrificial layers will not be over-etched, and adjacent lower electrodes subsequently formed will not bridge together.

Figure 2G:
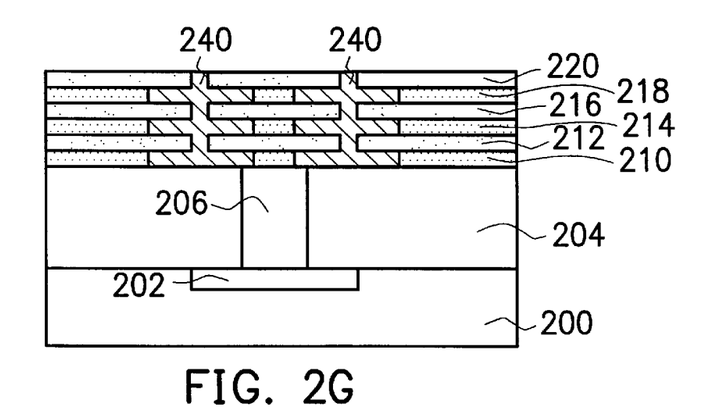

Referring to FIG. 2G, a conductive material layer 240 is formed to fill the tree-shaped opening 234 (the second opening 230 and the recesses 232). The conductive material layer 240 is preferably made of doped polysilicon. The conductive material layer 240 is formed by filling the tree-shaped opening 234 with conductive material, and then the first mask layer 222a and second mask layer 228, such as made of polysilicon, are removed by CMP or back etching.

Figure 2H:
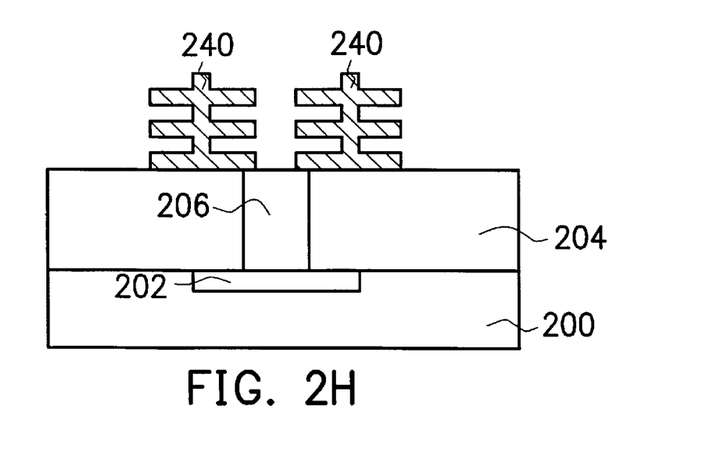

Referring to FIG. 2H, the sacrificial multi-layer is then removed. The second sacrificial layer 220, 216, 212 and the first sacrificial layer 218, 214, 210 are removed by, for example, BOE solution and phosphoric acid solution, alternatingly, to leave the tree-shaped polysilicon layer 240 serving as a lower electrode of a capacitor.

Next, a capacitor dielectric layer and an upper electrode (not shown) are formed on the lower electrode 240 to complete the capacitor.

According to the embodiments of the invention, the surface area of the stacked capacitor lower electrode is increased, thereby effectively enhancing the capacitance of the capacitor and improving the performance of the capacitor.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a lower electrode of a capacitor adapted for a semiconductor substrate, wherein the substrate has a conductive plug electrically connected to a conductive region, the method comprising:

forming a first polysilicon layer on the semiconductor substrate;

forming a sacrificial multi-layer on the first polysilicon layer, wherein the sacrificial multi-layer is a stack of alternating first and second sacrificial layers;

forming a second polysilicon layer on the sacrificial multi-layer;

patterning the second polysilicon layer to form a first opening therein above the conductive plug;

forming a planar spacer on a sidewall of the first opening;

forming a third polysilicon layer to fill the first opening;

anisotropically etching the planar spacer and the sacrificial multi-layer thereunder until exposing the first polysilicon layer to form a second opening while using the second polysilicon layer and the third polysilicon layer as a mask;

isotropically etching the first sacrificial layer exposed by the second opening to form a plurality of recesses thereon;

forming a fourth polysilicon layer to fill the second opening and the recesses;

removing the second polysilicon layer and third polysilicon layer;

removing the sacrificial multi-layer; and removing the exposed part of the first polysilicon layer.

2. The method according to claim 1, wherein the first polysilicon comprises a doped polysilicon layer.

3. The method according to claim 1, wherein the first sacrificial layer comprises a nitride layer.

4. The method according to claim 1, wherein the second sacrificial layer comprises an oxide layer.

5. The method according to claim 1, wherein a material of the planar spacer comprises oxide.

6. The method according to claim 1, wherein the steps for forming the planar spacer comprise:

forming a conformal spacer material layer on the second polysilicon layer and into the first opening; and back etching the spacer material layer on the second polysilicon layer and on the bottom of the first opening to form the planar spacer on the sidewall of the first opening.

7. The method according to claim 1, wherein the recesses and the conductive plug are overlaid.

8. The method according to claim 1, wherein the step of removing the first sacrificial layer includes using phosphoric acid solution.

9. The method according to claim 1, wherein the step of removing the second sacrificial layer includes using buffer oxide etching (BOE) solution.

10. A method of fabricating a lower electrode of a capacitor adapted for a semiconductor substrate, wherein the substrate has a conductive plug electrically connected to a conductive region, the method comprising:

forming a sacrificial multi-layer on the semiconductor substrate, wherein the sacrificial multi-layer is a stack of alternating first and second sacrificial layers;

forming a patterned first mask layer which has a first opening therein above the conductive plug;

forming a planar spacer on a sidewall of the first opening;

forming a second mask layer to fill the first opening;

anisotropically etching the planar spacer and the sacrificial multi-layer thereunder until exposing the semiconductor layer to form a second opening;

isotropically etching the first sacrificial layer exposed on the second opening to form a plurality of recesses therein;

filling the second opening and the recesses with a conductive material layer;

removing the first mask layer and second mask layer; and
removing the sacrificial multi-layer.

11. The method according to claim 10, wherein the first sacrificial layer comprises a nitride layer.

12. The method according to claim 10, wherein the second sacrificial layer comprises an oxide layer.

13. The method according to claim 10, wherein the first mask layer comprises a polysilicon layer.

14. The method according to claim 10, wherein a material of the planar spacer comprises oxide.

15. The method according to claim 10, wherein the steps of forming the planar spacer comprises:
   forming a conformal spacer material layer on the second polysilicon layer and in the first opening; and
   back etching the spacer material layer on the second polysilicon layer and on the bottom of the first opening to form the planar spacer on the sidewall of the first opening.

16. The method according to claim 10, wherein the second mask layer comprises a polysilicon layer.

17. The method according to claim 10, wherein the recesses and the conductive plug are overlaid.

18. The method according to claim 10, wherein the step of removing the first sacrificial layer includes using phosphoric acid solution.

19. The method according to claim 10, wherein the step of removing second sacrificial layer includes using buffer oxide etching (BOE) solution.

20. The method according to claim 10, wherein the conductive material layer comprises a doped polysilicon layer.

* * * * *